United States Patent [19]

Duddles et al.

[11] 4,370,700

[45] Jan. 25, 1983

[54] RF PACKAGE INCLUDING RF SHIELDING FOR A MULTIPLE PC BOARD

[75] Inventors: Allen L. Duddles, Tempe; Daniel G. Toomey, Scottsdale, both of Ariz.

[73] Assignee: Motorola Inc., Schaumburg

[21] Appl. No.: 321,287

[22] Filed: Nov. 13, 1981

Related U.S. Application Data

[63] Continuation of Ser. No. 156,156, Jun. 3, 1980, abandoned.

[51] Int. Cl.³ .............................................. H02B 1/08
[52] U.S. Cl. .................................... 361/424; 361/399; 174/35 R
[58] Field of Search ............... 361/380, 399, 395, 415, 361/417, 419, 424; 174/35 R

[56] References Cited

U.S. PATENT DOCUMENTS

| | | | |
|---|---|---|---|
| 3,323,091 | 5/1967 | Hibbets | 174/35 R |
| 3,816,911 | 6/1974 | Knappenberger | 361/424 |
| 4,063,788 | 12/1977 | Latasiewicz | 361/399 |

FOREIGN PATENT DOCUMENTS

| | | | |
|---|---|---|---|
| 1280355 | 10/1968 | Fed. Rep. of Germany | 361/399 |
| 2629053 | 1/1978 | Fed. Rep. of Germany | 361/399 |
| 480206 | 1/1976 | U.S.S.R. | 361/424 |

Primary Examiner—G. P. Tolin
Attorney, Agent, or Firm—Eugene A. Parsons

[57] ABSTRACT

A cast aluminum base including a flat portion and perpendicular upright walls having an RF printed circuit board mounted in abutting engagement with the ends of the walls parallel to the flat portion, the radiating circuits generally lying between the board and the flat portion, and encircled by the walls with a generally flat cover affixed to the walls on the opposite side of the board and spaced therefrom to completely enclose the board for RF shielding. Openings are formed through the board and flat plates having feedthrough components are affixed thereover to provide connections to the enclosed board and walls are provided between the board and the cover in encircling position relative to the circuits to be shielded.

4 Claims, 4 Drawing Figures

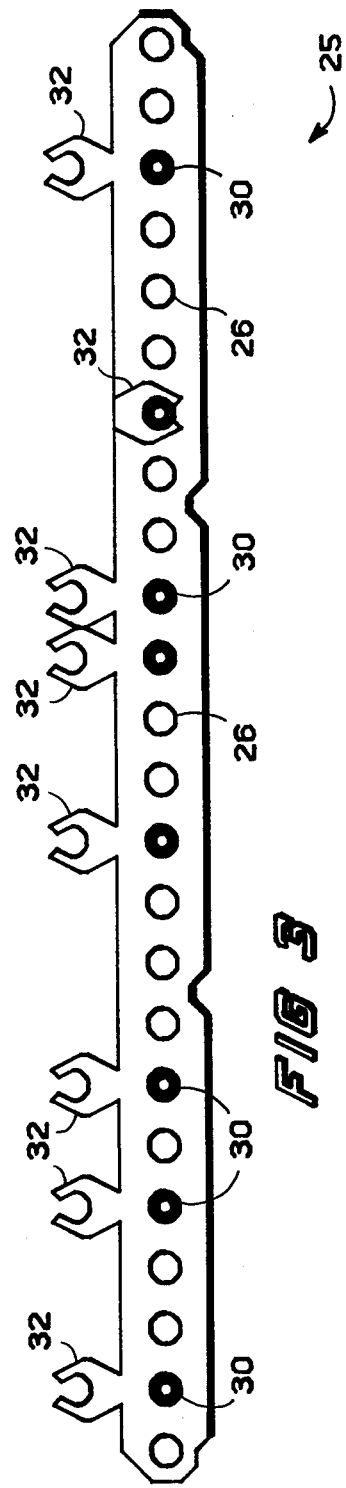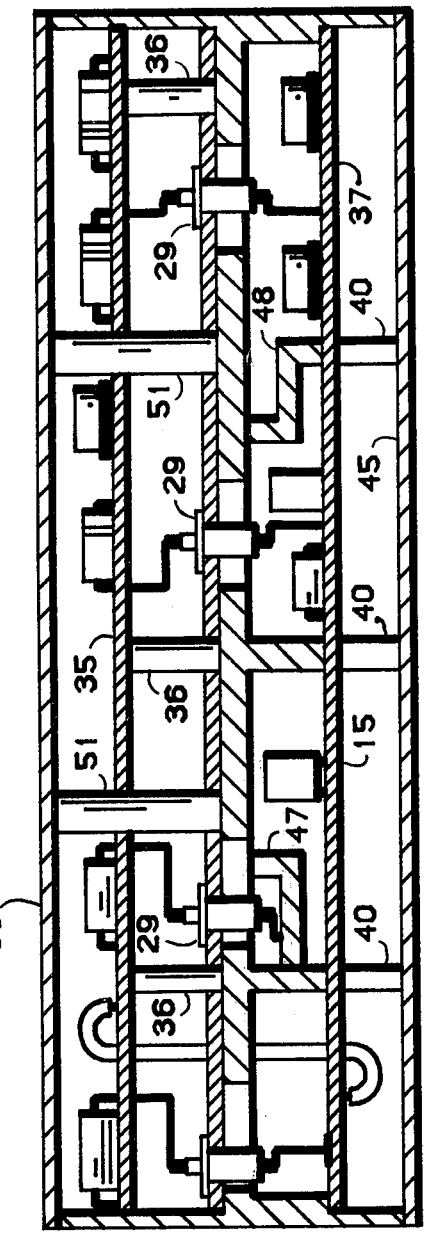

RF PACKAGE INCLUDING RF SHIELDING FOR A MULTIPLE PC BOARD

This is a continuation, of application Ser. No. 156,156, filed on June 3, 1980, now abandoned.

BACKGROUND OF THE INVENTION

In the prior art, when frequency synthesizers and the like are constructed it is common to use separate RF and digital modules to get proper RF isolation. This adds substantial weight, apparatus and cost to the structure.

A typical shielded RF circuit is disclosed in U.S. Pat. No. 3,816,911 entitled "Shielding Techniques For RF Circuitry", issued June 18, 1974 and assigned to the same assignee. In the above described patent thin metal strips are formed by chemical etching, which strips include bend or fold grooves similarly etched. The strips are then bent into the desired configuration at the time of assembly. The chemical etched strips are formed into side walls, bottom walls and top walls with tabs provided between the edges of the strips holding the boards and the various strips in place. Substantial assembly time is required for the apparatus and separate printed circuit boards are used for each circuit within each separate compartment.

SUMMARY OF THE INVENTION

The present invention pertains to an RF package for RF shielding a printed circuit board, which package includes base means having a planar portion with integrally formed perpendicular walls extending outwardly therefrom and designed to receive a printed circuit board in abutting engagement therewith so that the board is positioned parallel with and spaced from the planar portion and radiating components on the board are positioned between the board and the planar portion with the perpendicular walls encircling circuits on the board which are to be shielded. The planar portion of the base further including openings therethrough with flat plates having feedthrough components mounted thereon fixedly engaged over the openings to provide connections to the printed circuit board. A cover is affixed to the perpendicular walls generally parallel to the board on the side opposite the planar portion of the base and perpendicular walls mounted between the cover and the board in encircling position relative to the circuits to be shielded.

It is an object of the present invention to provide a new and improved RF package.

It is a further object of the present invention to provide a new and improved RF package wherein the major portion of the package is provided by a preformed base portion.

It is a further object of the present invention to provide an RF package having a base portion which may be constructed by casting or the like to greatly simplify the production thereof.

It is a further object of the present invention to provide an RF package including a preformed integral base constructed to have an RF printed circuit board mounted on one side thereof and a digital printed circuit board mounted on the other side thereof for greatly improved simplicity of construction and assembly.

These and other objects of this invention will become apparent to those skilled in the art upon consideration of the accompanying specification, claims, and drawings.

BRIEF DESCRIPTION OF THE DRAWINGS

Referring to the drawings, wherein like characters indicate like parts throughout the Figures:

FIG. 3 is a view in top plan of another portion of the RF package; and

FIG. 4 is a view of an assembled RF package with portions thereof broken away and shown in section.

DESCRIPTION OF THE PREFERRED EMBODIMENT

Figure 1:
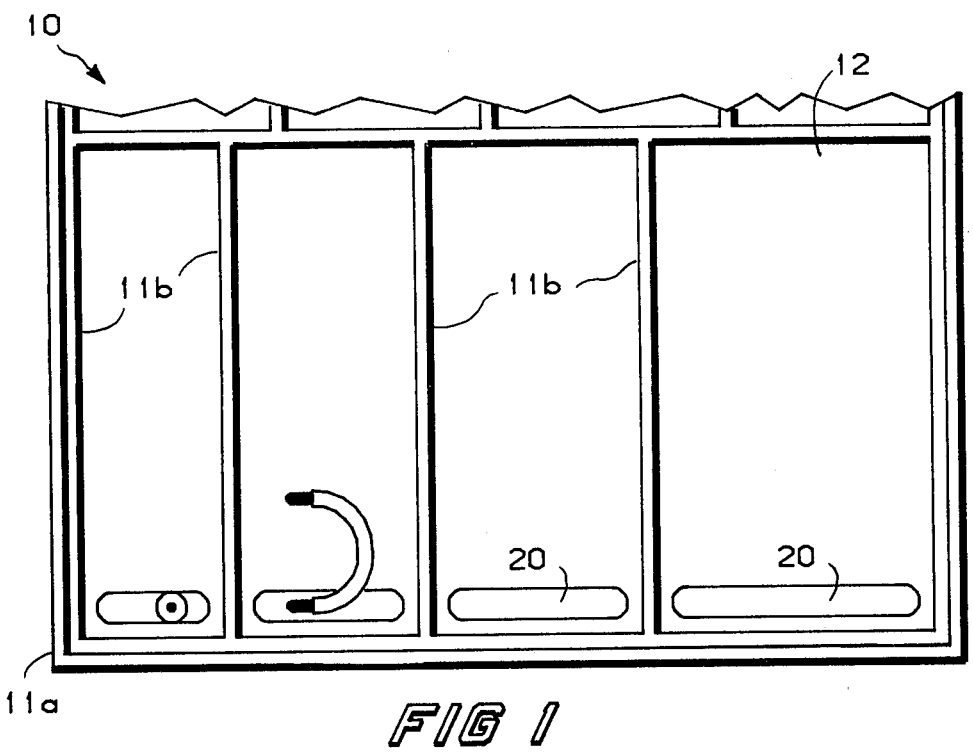
FIG. 1 is a view in top plan of a portion of the RF package embodying the present invention.
Figure 2:
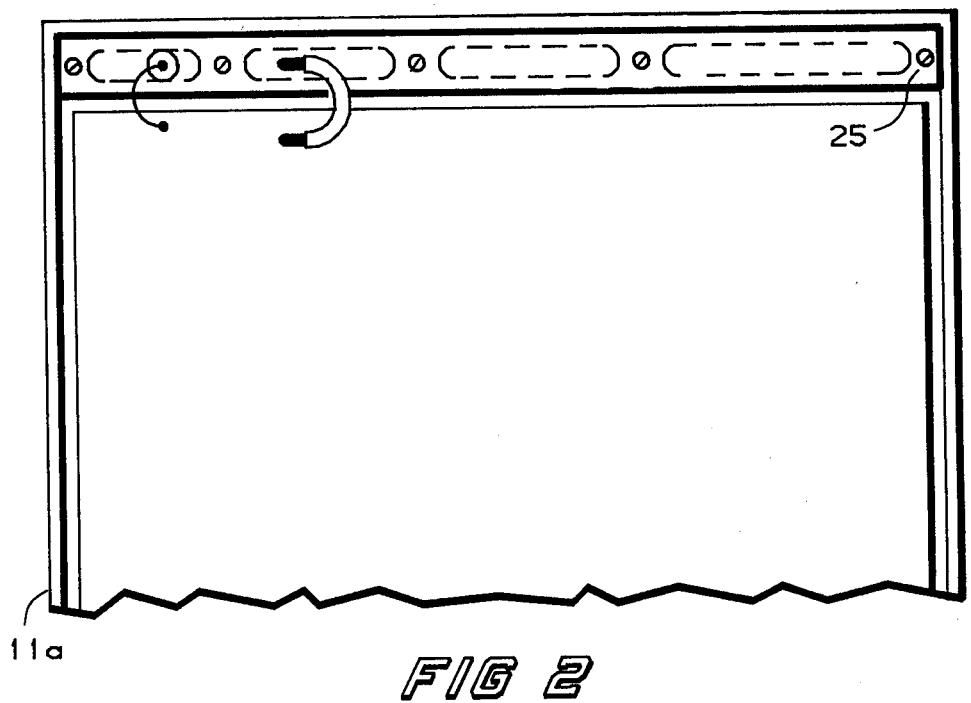
FIG. 2 is a view in bottom plan of the portion illustrated in FIG. 1.

Referring specifically to FIGS. 1 and 2, the numeral 10 generally designates base means having a planar portion or wall 12 and a plurality of perpendicular walls 11. The planar portion 12 and perpendicular walls 11 are formed in one integral unit and may be formed, for example, by casting, molding or the like. The base means 10 illustrated in FIGS. 1 and 2 is a double sided casting with walls 11 extending perpendicularly outwardly from the central planar portion 12. An outer perpendicular wall 11a extends completely around the periphery of the planar portion 12 and forms a compartment on one side thereof for receiving an RF printed circuit board 15 (illustrated assembled in FIG. 4) therein. Perpendicular walls 11b are somewhat shorter than 11a and are designed to butt against the RF board 15 and encircle various circuits thereon. The side walls 11a are formed with an inwardly extending shoulder at approximately the height of the walls 11b to receive the edges of the printed circuit board 15 in abutting engagement therewith. Thus, in the assembled position the printed circuit board 15 rests on the outer ends of the walls 11b and on the shoulders of the walls 11a and is fixedly engaged in this position by means of screws or the like.

The base means 10 is also formed with openings 20 extending through the planar portion 12 generally in each subcompartment formed by the perpendicular walls 11b. A flat plate 25 is formed of electrically conductive material, by chemical etching or the like. The flat plate 25 is constructed to be positioned over the openings 20, as illustrated in FIG. 2, and to be fixedly engaged with the planar portion 12, by screws or the like. The flat plate 25 has a plurality of openings 26 formed therein which are designed to receive feedthrough components, such as feedthrough capacitors, shielded RF cables, shielded coaxial cables, etc. Typical feedthrough filters or capacitors are illustrated at 29 in FIG. 4, mounted in the flat plate 25.

Referring to FIG. 3, several openings through the flat plate 25 are designated 30 and are designed to receive shielded RF cable therethrough. The openings 30 have a diameter substantially larger than the shielded cable and the mounting operation is generally as follows. The shielded cable is cut to the proper length so as to extend above and below the plate 25 (see FIG. 4) and a central portion of the outer insulation covering the shield is removed by means of a hot wire stripper or the like. The cable is then inserted into an opening 30 with the stripped portion of the shield positioned in juxtaposition to the plate 25. A tab 32, which is formed integrally with the plate 25 and in the same plane therewith, is bent from its perpendicularly, outwardly extending position, illustrated in FIG. 3, into a position parallel with the main portion of the plate 25 and partially overlying one of the openings 30. The tab 32 substantially reduces the diameter of the opening 30 to approximately the diameter of the cable shield so that the cable can be easily soldered into place without the necessity of filling an extremely large opening with solder. By grounding the shield of the cable at the plate 25 any RF signals that are prevalent on the shield are grounded at the plate 25 and do not carry through to the opposite side thereof. This greatly improves the shielding of the RF package.

In the assembly of the RF package, all of the feedthrough components are mounted on the plate 25 and, subsequently, the plate 25 is fixedly mounted on the base 10. The various feedthrough components are then connected to the RF printed circuit board 15 and to a digital printed circuit board 35 on the opposite side of the planar portion 12 of the base 10. The RF printed circuit board 15 is then positioned as previously described with the various components mounted on the board 15 between the board 15 and the planar portion 12 of the base 10. It will of course be understood that some components may be on the opposite side of the RF board 15 but any components which are likely to radiate RF signals should be affixed to the board 15 so as to be positioned between the board 15 and the base 10 within the compartment or subcompartments formed thereon. The digital printed circuit board 35 is positioned parallel with the opposite side of the planar portion 12. A plurality of perpendicular spacers 36 are affixed to the planar portion 12 by screws or the like and the board 35 is affixed to the spacers by screws or the like to hold the board in spaced relation from the planar portion 12. Since all of the interconnections between the boards 15 and 35 are made through the plate 25 at one end of each of the boards, the boards can easily be loosened by removing the mounting screws and tilted outwardly for service or repair.

The board 15 is formed with the normal printed circuits thereon and the side opposite the planar portion 12 of the base 10 is coated with a layer 37 of conductive material over substantially all blank areas. The layer 37 is of course applied so that it does not interfere with the circuit printed thereon, as is well known in the art.

A plurality of perpendicular walls 40 are formed from a flat portion of conducting material, such as by chemical etching or the like. The walls 40 are affixed to the opposite side of the board 15, by soldering or the like so as to extend perpendicularly outwardly therefrom in encircling position relative to the circuits thereon. Generally, the walls 40 are coextensive with the walls 11b on the other side of the board 15 and extend perpendicularly outwardly from the board 15 approximately the same distance as the side walls 11a. A cover 45, which is essentially a flat plate of conducting material, is positioned in abutting engagement with the walls 11a of the base 10 and the walls 40 and is fixedly attached in this position by means of screws or the like. Thus, the walls 11a of the base 10 form a compartment in conjunction with the cover 45 and the walls 40 form subcompartments encircling each of the circuits on the board 15. Grooves may be formed in the cover 45 to receive the walls 40 if desired for extra protection, but it has been determined that abutting engagement is generally sufficient for RF shielding. The base 10 and cover 45 completely enclose the board 15 and provide RF shielding between the board 15 and the surroundings while the walls 11b and 40 separate the enclosure into subcompartments encircling each circuit on the board 15 to shield each circuit from adjacent circuits. Additional shielding may be incorporated for specific components or circuits, if desired, by simply providing preformed portions of conductive material as illustrated at 47 and 48 of FIG. 4.

A cover 50, which is a flat plate of conducting material formed by chemical etching or the like, is positioned in abutting engagement with the opposite ends of the walls 11a, in overlying relationship to the digital printed circuit board 35 and spaced therefrom. Centrally located spacers 51 are attached to the planar portion 12 of the base 10 by screws or the like and extend vertically outwardly through the board 35. The cover 50 is attached in place by means of screws threadedly engaged with the outwardly extended ends of the spacers 51. Thus, both the RF printed circuit board 15 and the digital printed circuit board 35 are shielded from each other and from external RF signals or interference.

While a frequency synthesizer requiring an RF printed circuit board and a digital printed circuit board is illustrated in the present embodiment, it will of course be understood by those skilled in the art that other applications for the RF package can be devised. Further, external connections to the circuitry contained within the RF package are made through a slot formed in the side of the base 10 adjacent the printed circuit board 35 and an edge connector is inserted therein. While this form of external connection is utilized for convenience, those skilled in the art may devise a variety of apparatus for performing this function.

Thus, an improved RF package is disclosed which package includes base means having a planar portion with perpendicularly extending walls formed integrally therewith. The base means may be produced by casting or the like and may be formed, for example, of aluminum and coated with tin to improve the conductivity and appearance. Also, the base means might be molded from plastic and coated with a conductive material to provide the desired shielding and electrical conductivity. In either event the RF package is considerably simpler to construct than prior art structures and greatly simplifies the assembly thereof. Further, disassembling the structure for service or repair is greatly simplified and the improved plate carrying the feedthrough components for interconnection of the boards greatly aids in assembly and dismantling for repair.

While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of this invention.

We claim:
1. Apparatus for assembling into an RF package for RF shielding a printed circuit board having a plurality of circuits thereon requiring shielding from each other and from the surroundings, said apparatus comprising:
 (a) base means formed with at least electrically conductive surfaces and having a planar wall adapted to be positioned parallel with the printed circuit board and at least coextensive therewith and upright walls formed as an integral part of said planar wall and generally perpendicular thereto, outer portions of said upright walls defining one compartment for fixedly receiving the printed circuit board therein in overlying parallel, spaced apart relationship with respect to said planar wall and inner portions of said upright walls extending from said planar wall a shorter distance than said outer portions further defining a plurality of subcompartments within the one compartment wherein said inner portions of said upright walls extend from said planar wall for abutting engagement with one side of the printed circuit board and for encircling each of the plurality of circuits thereon;

(b) the planar wall being formed with at least one opening therethrough and the apparatus further including an electrically conductive planar member having at least one feedthrough component mounted thereon, said planar member being fixedly mounted on said planar wall in overlying relationship with the opening therethrough;

(c) cover means for being affixed to said upright walls of said base means in parallel spaced apart relationship with respect to said planar wall and cooperating with said outer portions of said upright walls for defining a single compartment between the printed circuit board, said upright walls and said cover means and for substantially enclosing the printed circuit board; and (d) wall means formed with at least electrically conductive surfaces and for mounting between said cover means and the printed circuit board in electrical contact with said cover means, generally parallel with said upright walls and for mounting in abutting engagement with the other side of the printed circuit board so as to divide the single compartment into subcompartments for generally encircling each of the plurality of circuits on the printed circuit board.

2. An RF package RF shielding a printed circuit board comprising:

(a) a printed circuit board having a plurality of circuits thereon requiring shielding from each other and from the surroundings, all components of the circuits, which components require shielding, being positioned on a first side of said board and the opposite side of said board having substantial portions plated with electrically conductive material including portions substantially encircling each of the plurality of circuits;

(b) base means formed with at least electrically conductive surfaces and having a planar portion positioned parallel with said printed circuit board and at least coextensive therewith and upright walls formed as an integral part of said planar portion and extending outwardly therefrom and generally perpendicularly thereto, outer portions of said upright walls defining one compartment having said printed circuit board fixedly positioned therein with the first side adjacent, parallel and spaced from said planar portion and inner portions of said upright walls extending outwardly a shorter distance from said planar portion than said outer portions and further defining a plurality of subcompartments within said one compartment wherein said upright walls extend from said planar portion into abutting engagement with the first side of said printed circuit board and encircle each of the plurality of circuits and components of the circuits therein;

(c) the planar portion being formed with at least one opeing therethrough and the apparatus further including an electrically conductive planar member having at least one feedthrough component mounted thereon, said planar member being fixedly mounted on said planar portion in overlying relationship with the opening therethrough;

(d) cover means affixed to said base means in parallel spaced apart relationship with respect to said printed circuit board and cooperating with said outer portions of said upright walls to define a single compartment between the printed circuit board, said upright walls and said cover means and substantially enclose said printed circuit board; and (e) wall means formed with at least electrically conductive surfaces and mounted between said cover means and said printed circuit board in electrical contact with said cover means and the electrially conductive material on the opposite side of said printed circuit board, said wall means being mounted generally parallel with said upright walls and in abutting engagement with the opposite side of said printed circuit board so as to divide the single compartment into subcompartments generally encircling each of the plurality of circuits on the printed circuit board.

3. An RF package as claimed in claims 1 or 2 wherein the planar member defines an opening therethrough for receiving a section of shielded cable therein, the opening having a diameter substantially larger than the diameter of the cable, and a bendable tab formed integrally with the planar member and in the same plane, the tab being bendable into a position parallel with the planar member and in overlying relationship with a portion of the opening to reduce the diameter of the opening to generally the same diameter as the shield of the cable.

4. An RF package as claimed in claim 3 including in addition a section of shielded cable positioned in the opening with the tab bent into the overlying relationship and the tab and cable shielding electrically connected to the planar member approximately at the opening.

* * * * *